(12) United States Patent
Benveniste et al.

(10) Patent No.: US 6,414,329 B1
(45) Date of Patent: Jul. 2, 2002

(54) METHOD AND SYSTEM FOR MICROWAVE EXCITATION OF PLASMA IN AN ION BEAM GUIDE

(75) Inventors: Victor M. Benveniste, Gloucester; William F. DiVergilio, Beverly; Frank Sinclair, Quincy, all of MA (US)

(73) Assignee: Axcelis Technologies, Inc., Beverly, MA (US)

(*) Notice: Subject to any disclaimer, the term of this patent is extended or adjusted under 35 U.S.C. 154(b) by 10 days.

(21) Appl. No.: 09/625,153

(22) Filed: Jul. 25, 2000

(51) Int. Cl.$^7$ .......................................... H01J 37/317
(52) U.S. Cl. ................................. 250/492.21
(58) Field of Search ..................... 250/288, 286, 250/492.21, 396 R, 396 ML

(56) References Cited

U.S. PATENT DOCUMENTS

| | | | |
|---|---|---|---|
| 4,383,177 A | | 5/1983 | Keller et al. |
| 4,686,365 A | * | 8/1987 | Meek et al. ............... 250/281 |
| 4,780,642 A | * | 10/1988 | Jacquot .................. 313/359.1 |
| 5,189,446 A | | 2/1993 | Barnes et al. |
| 5,206,516 A | | 4/1993 | Keller et al. |
| 5,350,926 A | * | 9/1994 | White et al. ........... 250/492.21 |
| 5,433,788 A | | 7/1995 | Mochizuki et al. |
| 5,523,652 A | * | 6/1996 | Sferalazzo et al. ...... 315/111.41 |
| 5,554,857 A | | 9/1996 | Benveniste |
| 5,576,538 A | * | 11/1996 | Sakai et al. .................. 250/251 |
| 5,703,375 A | | 12/1997 | Chen et al. |
| 5,925,886 A | * | 7/1999 | Seki et al. .............. 250/492.21 |
| 6,100,536 A | * | 8/2000 | Ito et al. ................. 250/492.21 |
| 6,242,750 B1 | * | 6/2001 | Takahashi et al. ...... 250/492.21 |
| 6,271,529 B1 | * | 8/2001 | Farley et al. .......... 250/492.21 |
| 6,297,594 B1 | * | 10/2001 | Sakai et al. ............. 315/111.41 |

FOREIGN PATENT DOCUMENTS

JP 9-180662 7/1997

* cited by examiner

Primary Examiner—Kiet T. Nguyen
(74) Attorney, Agent, or Firm—Eschweiler & Associates, LLC

(57) ABSTRACT

An apparatus and method for providing a low energy, high current ion beam for ion implantation applications are disclosed. The apparatus includes a mass analysis magnet mounted in a passageway along the path of an ion beam, a power source adapted to provide an electric field in the passageway, and a magnetic device adapted to provide a multi-cusped magnetic field in the passageway, which may include a plurality of magnets mounted along at least a portion of the passageway. The power source and the magnets may cooperatively interact to provide an electron cyclotron resonance (ECR) condition along at least a portion of the passageway. The multi-cusped magnetic field may be superimposed on the dipole field at a specified field strength in a region of the mass analyzer passageway to interact with an electric field of a known RF or microwave frequency for a given low energy ion beam. The invention further comprises a mass analyzer waveguide adapted to couple the electric field to the beam plasma consistently along the length of the mass analyzer passageway to thereby improve the creation of the ECR condition. The invention thus provides enhancement of beam plasma within a mass analyzer dipole magnetic field for low energy ion beams without the introduction of externally generated plasma. The invention further includes a method of providing ion beam containment in a low energy ion implantation system, as well as an ion implantation system.

25 Claims, 16 Drawing Sheets

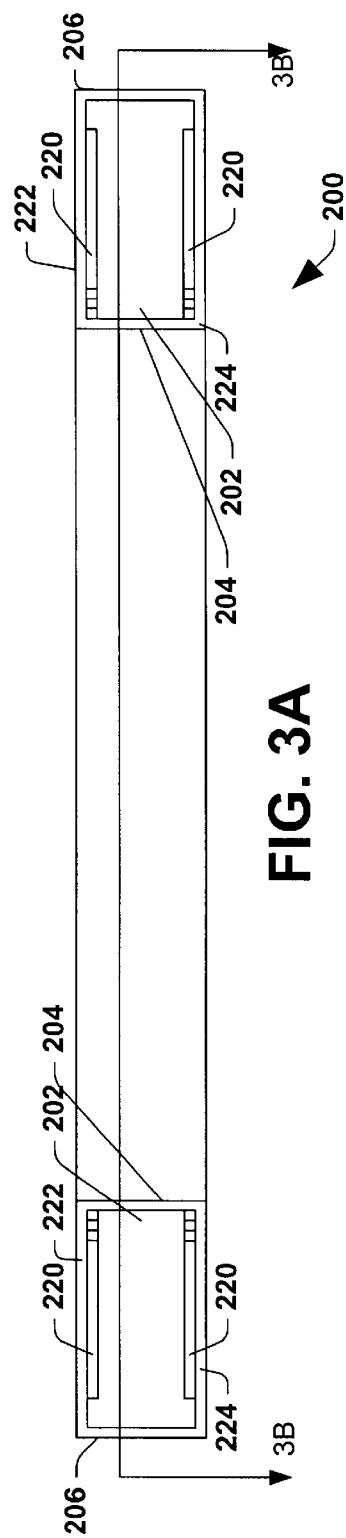
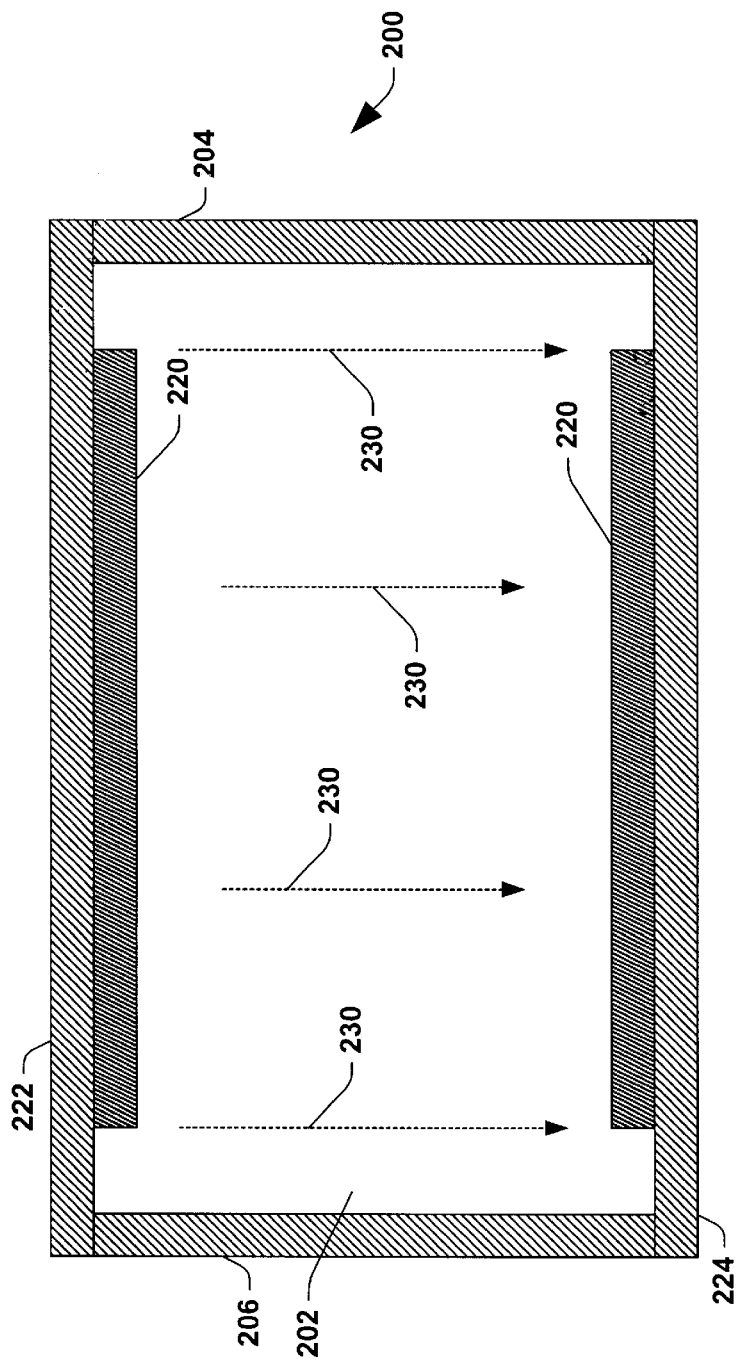
FIG. 3A
FIG. 4

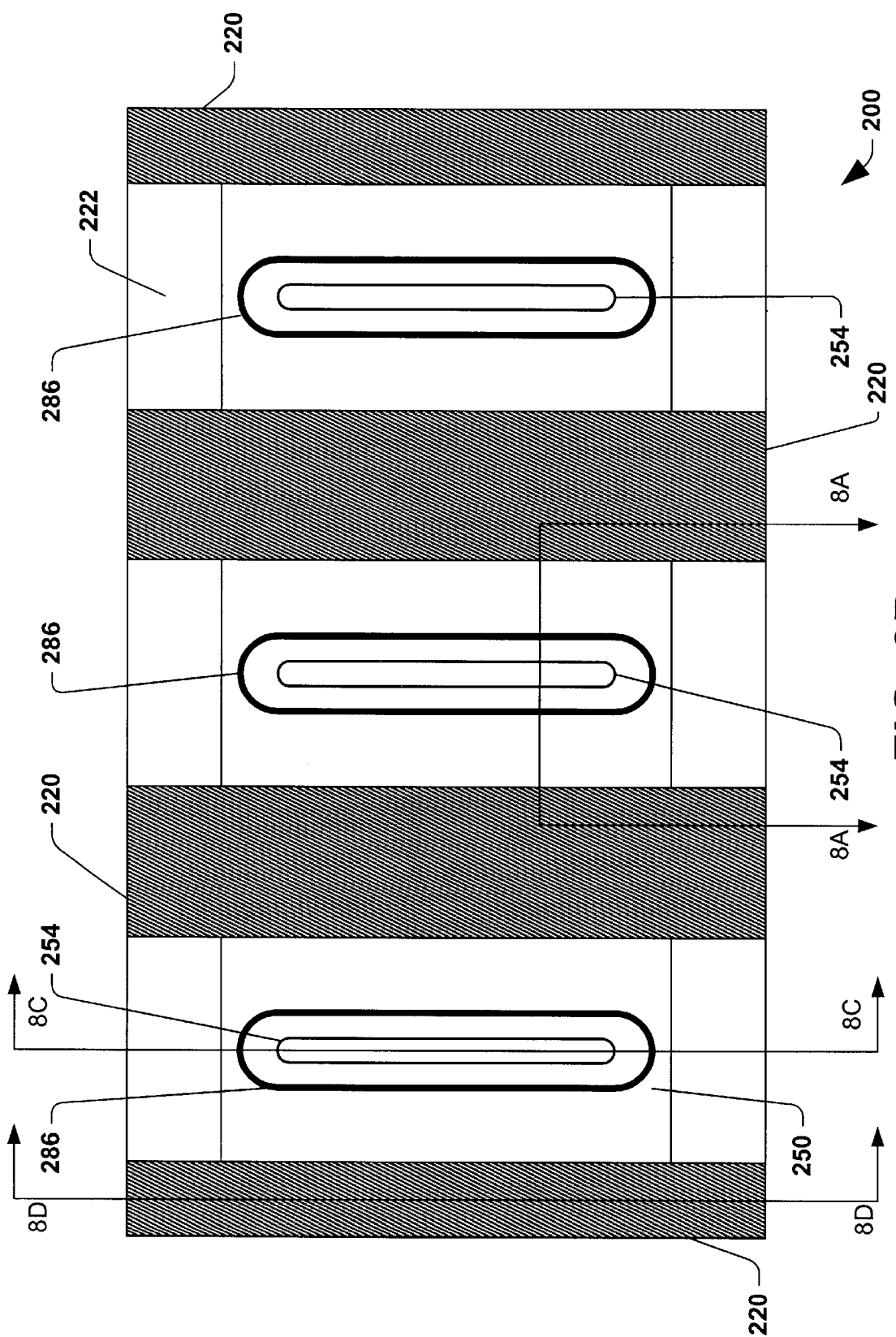

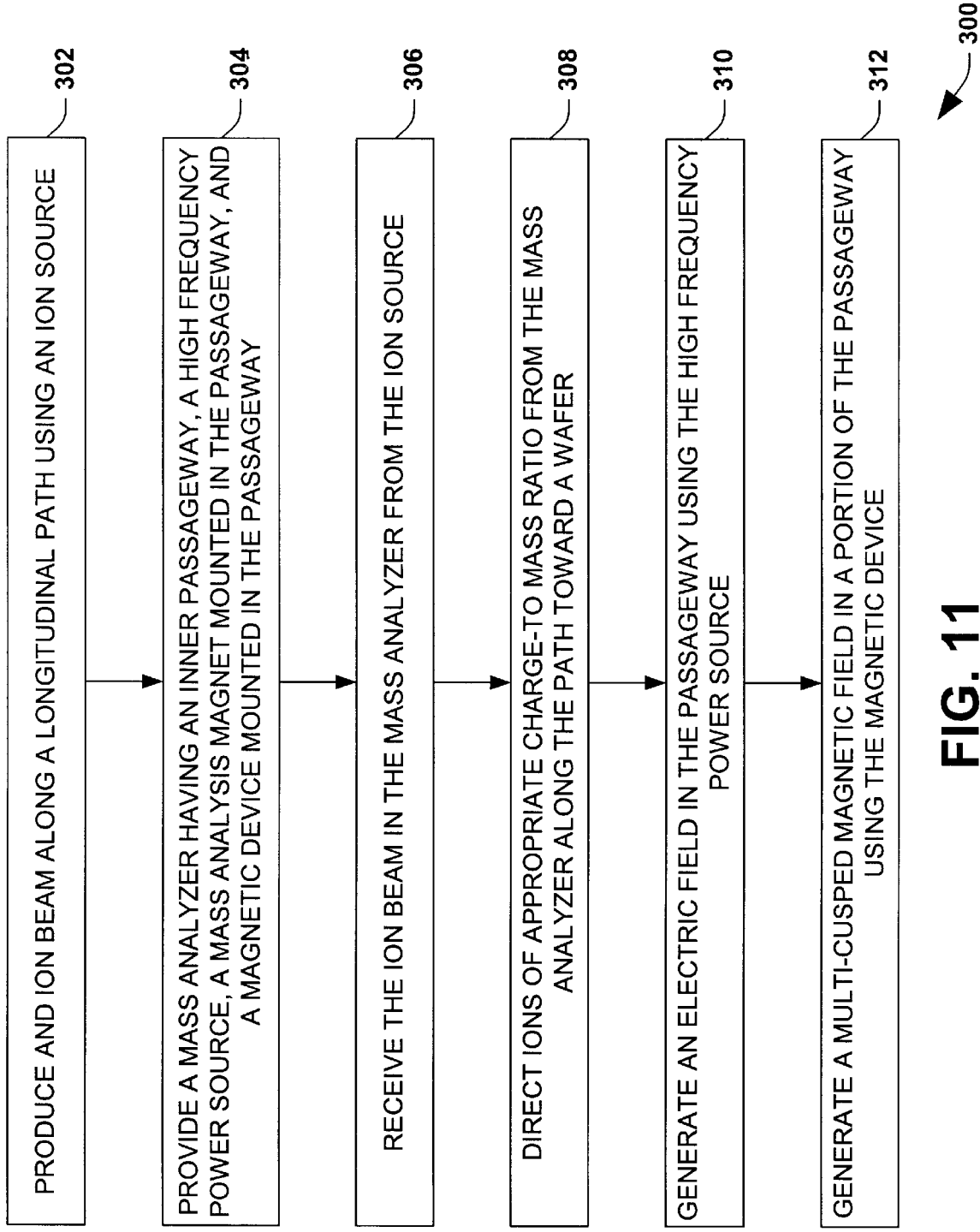

METHOD AND SYSTEM FOR MICROWAVE EXCITATION OF PLASMA IN AN ION BEAM GUIDE

FIELD OF THE INVENTION

The present invention relates generally to ion implantation systems, and more specifically to an improved method and system for microwave excitation of plasma in an ion beam guide.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic materials doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway must be evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

For shallow depth ion implantation, high current, low energy ion beams are desirable. In this case, the reduced energies of the ions cause some difficulties in maintaining convergence of the ion beam due to the mutual repulsion of ions bearing a like charge. High current ion beams typically include a high concentration of similarly charged ions which tend to diverge due to mutual repulsion. To maintain low energy, high current ion beam integrity at low pressures, a plasma may be created to surround the ion beam. High energy ion implantation beams typically propagate through a weak plasma that is a byproduct of the beam interactions with the residual or background gas. This plasma tends to neutralize the space charge caused by the ion beam, thereby largely eliminating transverse electric fields that would otherwise disperse the beam. However, at low ion beam energies, the probability of ionizing collisions with the background gas is very low. Moreover, in the dipole magnetic field of a mass analyzer, plasma diffusion across magnetic field lines is greatly reduced while the diffusion along the direction of the field is unrestricted. Consequently, introduction of additional plasma to improve low energy beam containment in a mass analyzer is largely futile, since the introduced plasma is quickly diverted along the dipole magnetic field lines to the passageway chamber walls.

In ion implantation systems, there remains a need for a beam containment apparatus and methodologies for use with high current, low energy ion beams which may be operated at low pressures, and which provides uniform beam containment along the entire length of a mass analyzer beam guide.

SUMMARY OF THE INVENTION

The present invention is directed to an apparatus and method for providing a low energy, high current ion beam for ion implantation applications. The invention provides ion beam containment without the introduction of auxiliary plasma and instead enhances beam plasma associated with the ion beam by utilizing the background gas in the beam guide to create the additional electrons required for adequate beam containment. This is accomplished by providing a multi-cusped magnetic field and RF or microwave energy in a beam guide passageway in order to create an ECR condition in a controlled fashion, as illustrated and described in greater detail hereinafter.

Ion beams propagating through a plasma, such as the beam plasma created by beam interactions with the residual or background gas, reach a steady state equilibrium wherein charges produced by ionization and charge exchange are lost to the beam guide. The remaining plasma density results from a balance between charge formation due to the probability of ionizing collisions, and losses from the beam volume due to repulsion of positive charges by the residual space charge and electron escape as a result of kinetic energy.

Absent plasma enhancement through the introduction of externally generated plasma or enhancement of the beam plasma, the probability for ionizing collisions with the background gas at very low ion beam energies is low. Electrons generated in such a manner are trapped in the beam's large potential well, orbiting around and through the beam center, interacting with each other by Coulomb collisions, resulting in thermalization of the electron energy distribution. Those electrons in the distribution having an energy greater than the ionization potential of the residual gas molecule have a probability of ionizing such a molecule. The ionizing probability decreases as the electron energy decreases.

In a low energy beam plasma, the majority of the ionization is produced by the trapped electrons. These electrons derive their energy from the center-to-edge beam potential difference, which is the same parameter that causes beam "blow-up". Thus, transportation of low energy ion beams is difficult absent externally generated plasma or enhancement of the beam plasma. Because mass analyzers inherently involve magnetic fields, externally generated plasma fails to diffuse adequately along the arcuate length of a mass analyzer beam guide, instead diffusing quickly along the direction of the magnetic field lines. The use of RF or microwave energy in a mass analyzer beam guide passageway together with a multi-cusped magnetic field in accordance with the present invention provides for enhancement of the beam plasma in a low pressure, low energy, high current ion beam system through the controlled creation of an ECR condition in the passageway. Additionally, the multi-cusped magnetic field enhances the plasma density through the magnetic mirror effect.

Additional plasma may thus be generated within the ion beam space by electric fields at RF or microwave frequencies. This RF or microwave energy is transferred efficiently to plasma electrons, when a proper magnetic field is present, at a magnitude that yields the ECR condition. The RF or microwave energy may be introduced into the passageway at an appropriate port in the beam guide via any number of coupling methods (e.g., windows, antennas, and the like). Although the dipole magnetic field alone might be employed for the creation of an ECR condition, the selection of the dipole magnetic field strength for a mass analysis magnet is dictated by the momentum of the particle selected for implantation. Consequently, the RF or microwave power source frequency would need to be tuned to that which provides the ECR condition according to the dipole magnetic field strength.

For example, for very low energy Boron beams, the dipole magnetic field is well below the ECR condition at the common 2.45 GHz microwave frequency. Lower frequency energy sources (or variable frequency sources) are available, but are costly. In addition, there is an advantage to using the highest available frequency, as the plasma density limit is proportional to the square of the frequency employed. Thus, the ability to use a high frequency power source in a low energy ion beam application via the selective employment of a controlled multi-cusped magnetic field allows for higher plasma density as well as reduced cost.

According to one aspect of the invention, the apparatus comprises a mass analysis magnet mounted around a passageway along the path of an ion beam, an RF power source adapted to provide an electric field in the passageway, and a magnetic device adapted to provide a multi-cusped magnetic field in the passageway. The passageway thus serves as a waveguide as well as a beamguide. According to another aspect of the invention, the magnetic device comprises a plurality of magnets mounted along at least a portion of the passageway, whereby the power source and the magnets cooperatively interact to provide an electron cyclotron resonance (ECR) condition along at least a portion of the passageway.

The multi-cusped magnetic field may be superimposed on the dipole field at a specified field strength in a region of the mass analyzer passageway to interact with an electric field of a known RF or microwave frequency for a given low energy ion beam. In this manner, the beam plasma within a mass analyzer dipole magnetic field is enhanced for low energy ion beams without the introduction of externally generated plasma. The RF or microwave energy is efficiently transferred to plasma electrons in the presence of a magnetic field that yields an ECR condition. According to one aspect of the present invention, the ECR condition for a particular ion beam type is dependent upon both the electric field frequency and the magnetic field strength. However, the dipole magnetic field of the mass analysis magnet is typically fixed according to the desired selection of an ion charge-to-mass ratio and the magnitude of the beam energy to be directed to a target wafer.

The other ECR condition variables being thus fixed, an electric field energy source frequency is thus determined. The creation of a multi-cusped magnetic field in the passageway of a mass analyzer according to the present invention advantageously provides localized control over the magnetic field strength within the passageway, which allows use of RF or microwave energy sources at common or commercially available frequencies (e.g., 2.45 GHz). In addition to providing regions of magnetic field strength which satisfy the ECR condition for an appropriate frequency, the multi-cusped magnetic field also increases plasma confinement through a magnetic mirror effect, which significantly enhances the plasma density by reducing losses.

According to another aspect of the invention, the magnetic device may comprise a plurality of longitudinally spaced laterally extending magnets disposed on the top and bottom sides of the mass analyzer beam guide passageway. The magnets may include longitudinally opposite magnetic poles of opposite magnetic polarity, with poles of like polarity on adjacent magnets facing one another, whereby the multi-cusp magnetic field is generated in the passageway. In this manner, an ECR condition may be established near at least two longitudinally facing magnetic poles of at least two adjacent magnets and spaced from one of the top and bottom sides by a specified distance. The magnets creating the multi-cusped field may thus be designed to create an ECR region spaced from one or more of the passageway walls, providing a controlled confinement or containment of a passing ion beam.

According to still another aspect of the invention, an ion implantation system is provided, which comprises an ion source adapted to produce an ion beam along a path and a mass analyzer having an inner passageway. The mass analyzer includes a high frequency power source, a mass analysis magnet mounted in the inner passageway, and a magnetic device mounted in the inner passageway, wherein the mass analyzer is adapted to receive the ion beam from the ion source and to direct ions of an appropriate charge-to-mass ratio along the path toward a wafer. The high frequency power source is adapted to provide an RF or microwave electric field in the inner passageway, and the magnetic device is adapted to provide a multi-cusped magnetic field in the inner passageway. The magnetic device may comprise a plurality of magnets mounted along at least a portion of the passageway, which generate the multi-cusped magnetic field. The magnetic and electric fields may interact to create an ECR condition within the mass analyzer which advantageously enhances the beam plasma, thereby neutralizing the space charge of the ion beam.

According to yet another aspect of the invention, there is provided a method of providing ion beam containment in a low energy ion implantation system. The method comprises producing an ion beam along a longitudinal path using an ion source, providing a mass analyzer having an inner passageway and a mass analysis magnet mounted along the inner passageway, and receiving the ion beam in the mass analyzer from the ion source. The method further comprises directing ions of appropriate charge-to-mass ratio and energy from the mass analyzer along the path toward a wafer, generating an electric field in the passageway using a high frequency power source, and generating a multi-cusped magnetic field in at least a portion of the passageway using a magnetic device mounted along the passageway. In addition, the method may further comprise creating an electron cyclotron resonance condition in at least one region in the passageway using the electric field and the magnetic field.

The plasma enhancement and the resulting beam containment may be further aided by the controlled provision of electric field energy in the passageway of a mass analyzer.

Generating this electric field in the passageway may be furthered using a separate waveguide to consistently distribute the electric field energy within the passageway in a controlled fashion. In this manner, the energy distribution may be made more uniform along the longitudinal passageway of the beam guide, allowing creation of electron cyclotron resonance regions throughout the entire length thereof.

According to another aspect of the present invention, there is provided a waveguide for coupling microwave energy from a power source with a beam plasma in a passageway of an ion beam mass analyzer beam guide. The waveguide includes a first dielectric layer surrounded by a metallic coating adapted to propagate microwave energy from the power source throughout the length of the beam guide passageway. The metallic coating may thus form a second and third layer on the top and bottom sides of the first layer. The first layer extends longitudinally along an arcuate path in a first plane from an entrance end to an exit end, and laterally between an inner radial side and an outer radial side. The waveguide further includes laterally extending longitudinally spaced ports or slots through the metallic coating on the side facing the beam guide passageway. The longitudinally spaced ports or slots may be positioned advantageously along the waveguide to correspond to the nodes of a standing wave to thereby effectuate an efficient transfer of power to the beam guide.

In this regard, along the waveguide, a plurality of laterally extending longitudinally spaced magnets may be provided which are adapted to provide a multi-cusped magnetic field in the beam guide passageway. In this way, the multi-cusped magnetic field and the microwave energy from the power source may cooperatively interact to create an electron cyclotron resonance condition along at least a portion of the passageway for beam containment, and the plasma may further be enhanced via the magnetic mirror effect.

According to still another aspect of the invention, a mass analyzer beam guide apparatus is provided for conditioning an ion beam along a path in an ion implantation system. This apparatus comprises a mass analysis magnet mounted in a passageway along the path, a power source adapted to provide an electric field in the passageway, a waveguide adapted to couple the electric field with a beam plasma associated with the ion beam, and a magnetic device adapted to provide a multi-cusped magnetic field in the passageway. Accordingly, the power source, the waveguide, and the magnetic device may be cooperatively adapted to provide containment of the ion beam in at least a portion of the passageway. The beam containment may advantageously be accomplished via an electron cyclotron condition established through the cooperative interaction in the passageway of an RF or microwave electric field powered by the power source and the magnetic device, which may create a multi-cusped magnetic field in the interior of the passageway.

According to yet another aspect of the invention, a waveguide is provided for coupling an electric field with a plasma in an ion beam mass analyzer passageway. The waveguide comprises a base layer located in a first plane adapted to propagate microwave energy from a power source, and having a top, bottom, and lateral metallic layers extending longitudinally along an arcuate path from an entrance end to an exit end and laterally between an inner radial side and an outer radial side. The bottom layer may include a plurality of laterally extending longitudinally spaced ports or slots therethrough between the interior of the passageway and the base layer. Microwave energy from the power source propagating along the base layer is coupled with the plasma in the interior of the passageway near the laterally extending longitudinally spaced ports or slots.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3A is an end elevation view of the exemplary mass analyzer of FIG. 2 having a plurality of magnets for generating a multi-cusped magnetic field in accordance with another aspect of the invention;

FIG. 4 is a sectional elevation view of the exemplary mass analyzer taken along line 4—4 of FIG. 2;

FIG. 8B is a sectional top plan view of a portion illustrating the exemplary waveguide and magnets of FIG. 8A;

FIG. 11 is a schematic flow diagram illustrating a method of providing ion beam containment in an ion implantation system in accordance with another aspect of the invention.

DETAILED DESCRIPTION OF THE INVENTION

Figure 1A:
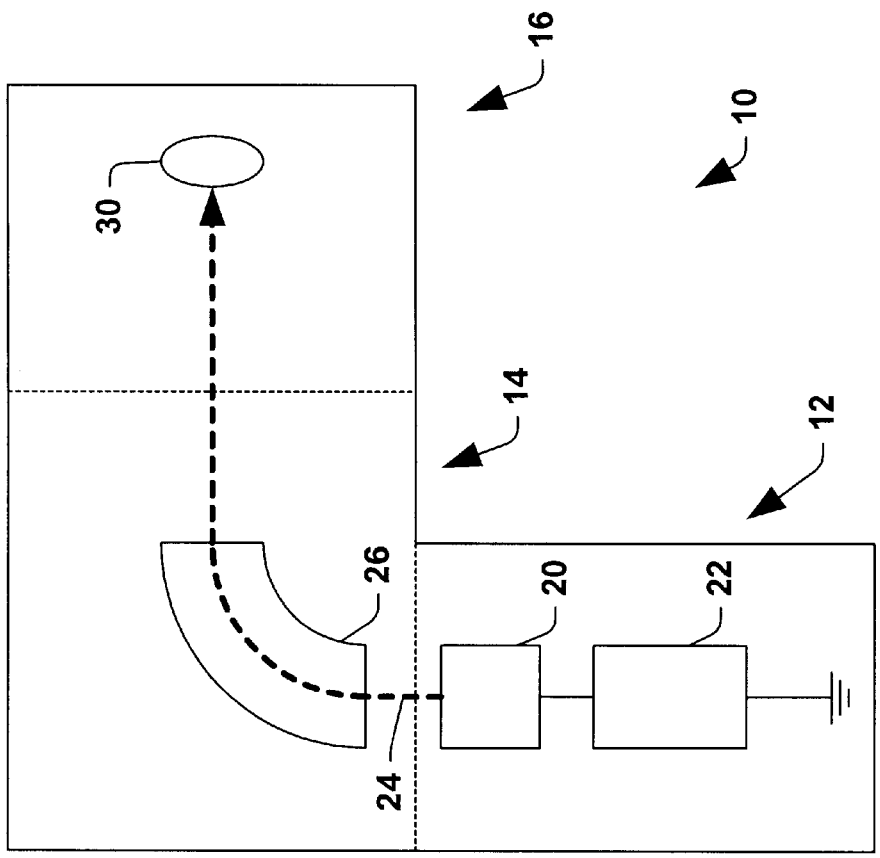
FIG. 1A is a schematic block diagram illustrating a typical low energy ion implantation system having a mass analyzer in which the beam containment apparatus and methodology of the present invention may be employed.

The present invention will now be described with reference to the drawings wherein like reference numerals are used to refer to like elements throughout. The present invention provides for beam containment in a low energy, high current ion implantation system at low pressures without requiring the introduction of externally generated plasma by enhancing the beam plasma using a multi-cusp magnetic field in combination with RF or microwave energy to create an ECR condition in a mass analyzer. However, it will be appreciated that the invention may be advantageously employed in applications other than those illustrated and described herein.

Referring now to the drawings, in FIG. 1A, a low energy ion implanter 10 is illustrated, having a terminal 12, a beamline assembly 14, and an end station 16. The terminal 12 includes an ion source 20 powered by a high voltage power supply 22. The ion source 20 produces an ion beam 24 which is provided to the beamline assembly 14. The ion beam 24 is conditioned by a mass analysis magnet 26. The mass analysis magnet 26 passes only ions of appropriate charge-to-mass ratio to a wafer 30. The conditioned ion beam 24 is then directed toward the target wafer 30 in the end station 16.

Figure 1B:
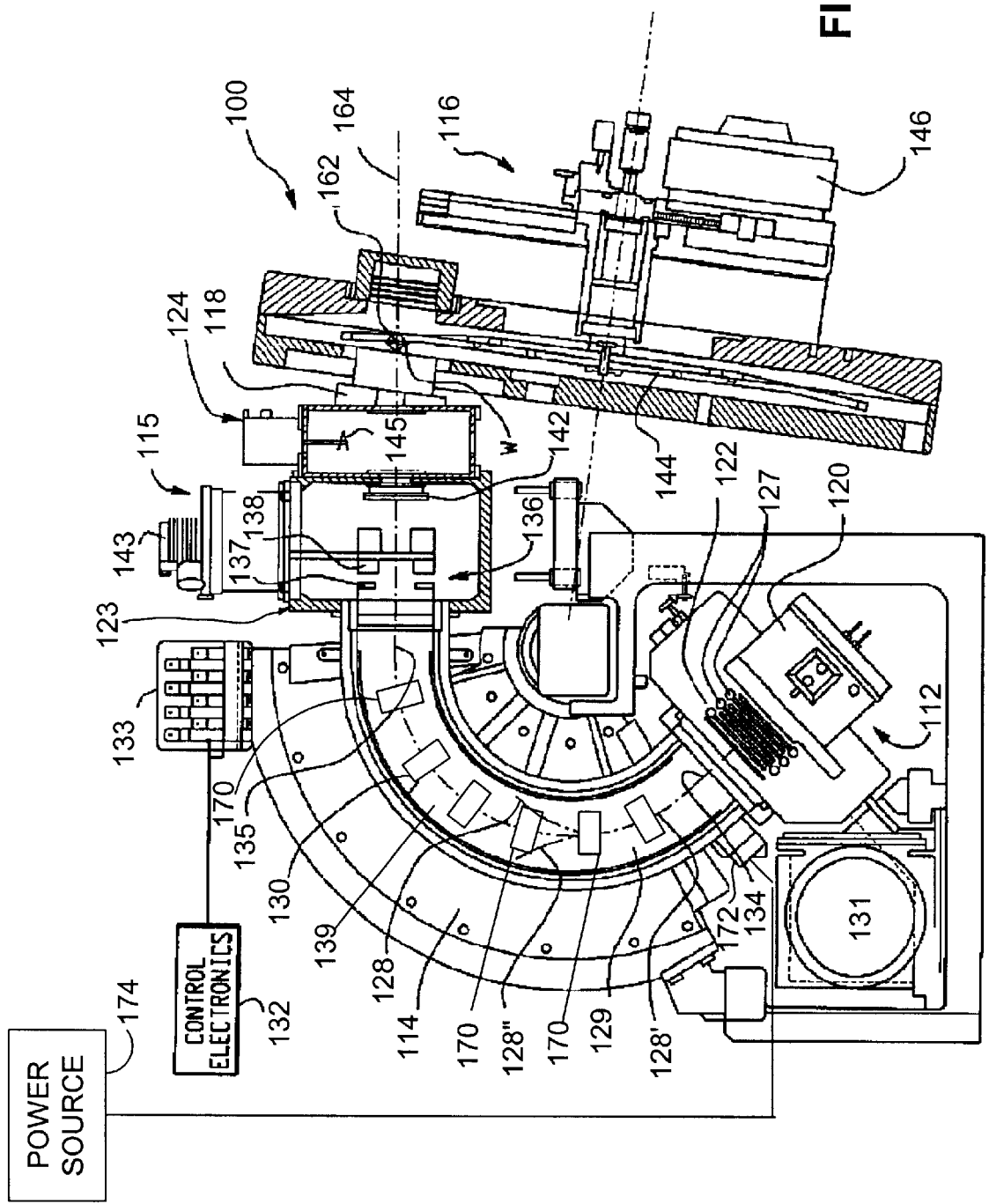
FIG. 1B is a schematic view of an ion implanter for ion beam treatment of a workpiece, including a beam containment apparatus in accordance with the invention.

Referring also to FIG. 1B, an ion implanter 100 is illustrated in greater detail in accordance with an exemplary aspect of the present invention, and has an ion source 112, a mass analysis magnet 114, a beamline assembly 115, and a target or end station 116. An expansible stainless steel bellows assembly 118, which permits movement of the end station 116 with respect to the beamline assembly 115, connects the end station 116 and the beamline assembly 115. Although FIG. 1B illustrates an ultra low energy (ULE) ion implanter, the present invention has applications in other types of implanters as well.

The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The mass analysis magnet 114 functions to pass only ions of an appropriate charge-to-mass ratio to the beamline assembly 115, which comprises a resolver housing 123 and a beam neutralizer 124. The mass analysis magnet 114 includes a curved beam path 129 within a passageway 139 defined by an aluminum beam guide having side walls 130, evacuation of which is provided by a vacuum pump 131. The ion beam 128 that propagates along this path 129 is affected by the magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133.

The dipole magnetic field causes the ion beam 128 to move along the curved beam path 129 from a first or entrance trajectory 134 near the ion source 112 to a second or exit trajectory 135 near the resolving housing 123. Portions 128' and 128" of the beam 128, comprised of ions having an inappropriate charge-to-mass ratio, are deflected away from the curved trajectory and into the walls of an aluminum beam guide 130. In this manner, the magnet 114 passes to the resolving housing 123 only those ions in the beam 128 which have the desired charge-to-mass ratio.

The passageway 139 further comprises a magnetic device including one or more magnets 170 disposed laterally along the beam path 129. The magnets 170 are mounted above and below the beam path 129 to create a multi-cusped magnetic field (not shown in FIG. 1B) in the passageway 139. A high frequency electric field (not shown in FIG. 1B) is also provided in the passageway 139 via a microwave injection port 172 which couples a power source 174 with the passageway 139. The multi-cusped magnetic field and the high frequency electric field in the passageway 139 cooperatively interact to create an electron cyclotron resonance condition in at least one region (not shown in FIG. 1B) of the passageway in order to provide beam containment of the ion beam 128, as described in greater detail infra.

The resolver housing 123 includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer and resolver housings are evacuated by a vacuum pump 143.

Downstream of the beam neutralizer 124 is the end station 116, which includes a disk-shaped wafer support 144 upon which wafers to be treated are mounted. The wafer support 144 resides in a target plane which is generally perpendicularly oriented to the direction of the implant beam. The disc shaped wafer support 144 at the end station 116 is rotated by a motor 146. The ion beam thus strikes wafers mounted to the support as they move in a circular path. The end station 116 pivots about point 162, which is the intersection of the path 164 of the ion beam and the wafer W, so that the target plane is adjustable about this point.

Figure 2:
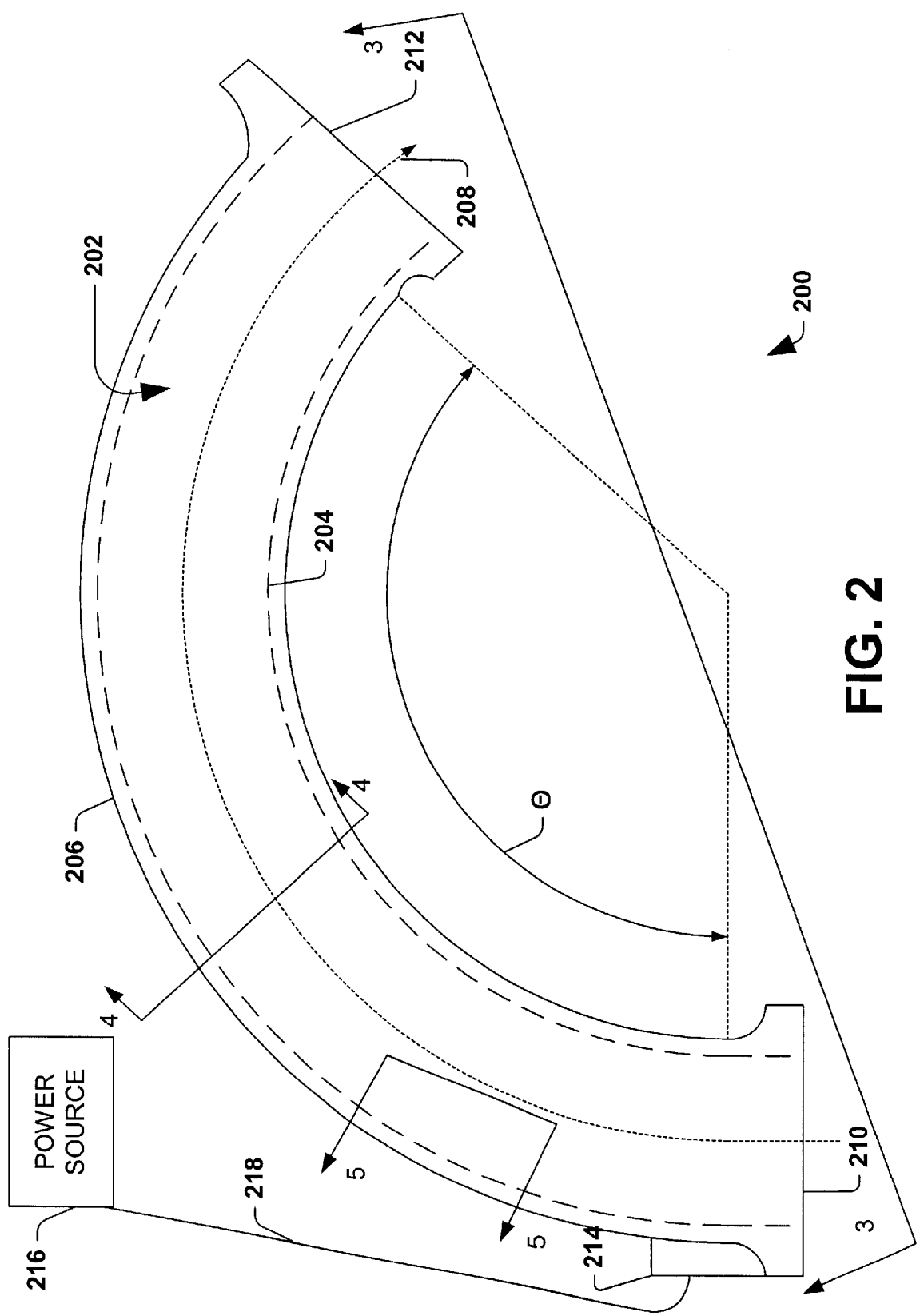
FIG. 2 is a top plan view of an exemplary mass analyzer beam guide according to an aspect of the invention.

FIG. 2 illustrates an exemplary mass analyzer beam guide 200 for use in a low energy ion implantation system (e.g., low energy ion implanter 10 of FIG. 1B), having an arcuate longitudinal passageway 202 defined by inner and outer arcuate side walls 204 and 206, respectively, along an ion beam path 208. The beam guide 200 extends longitudinally along the path 208 from an entrance end 210 to an exit end 212 through an arc angle θ which may be approximately 135 degrees, for example. Beam guide 200 further comprises a microwave injection port 214 which provides coupling of RF or microwave energy from a power source 216 with the passageway 202 via a cable 218.

The beam guide further includes a mass analysis magnet comprising two arcuate magnet poles (not shown in FIG. 2) to provide a dipole magnetic field in the passageway 202 which allows ions of a selected charge-to-mass ratio to reach the exit end 212 along the path 208.

Figure 3B:
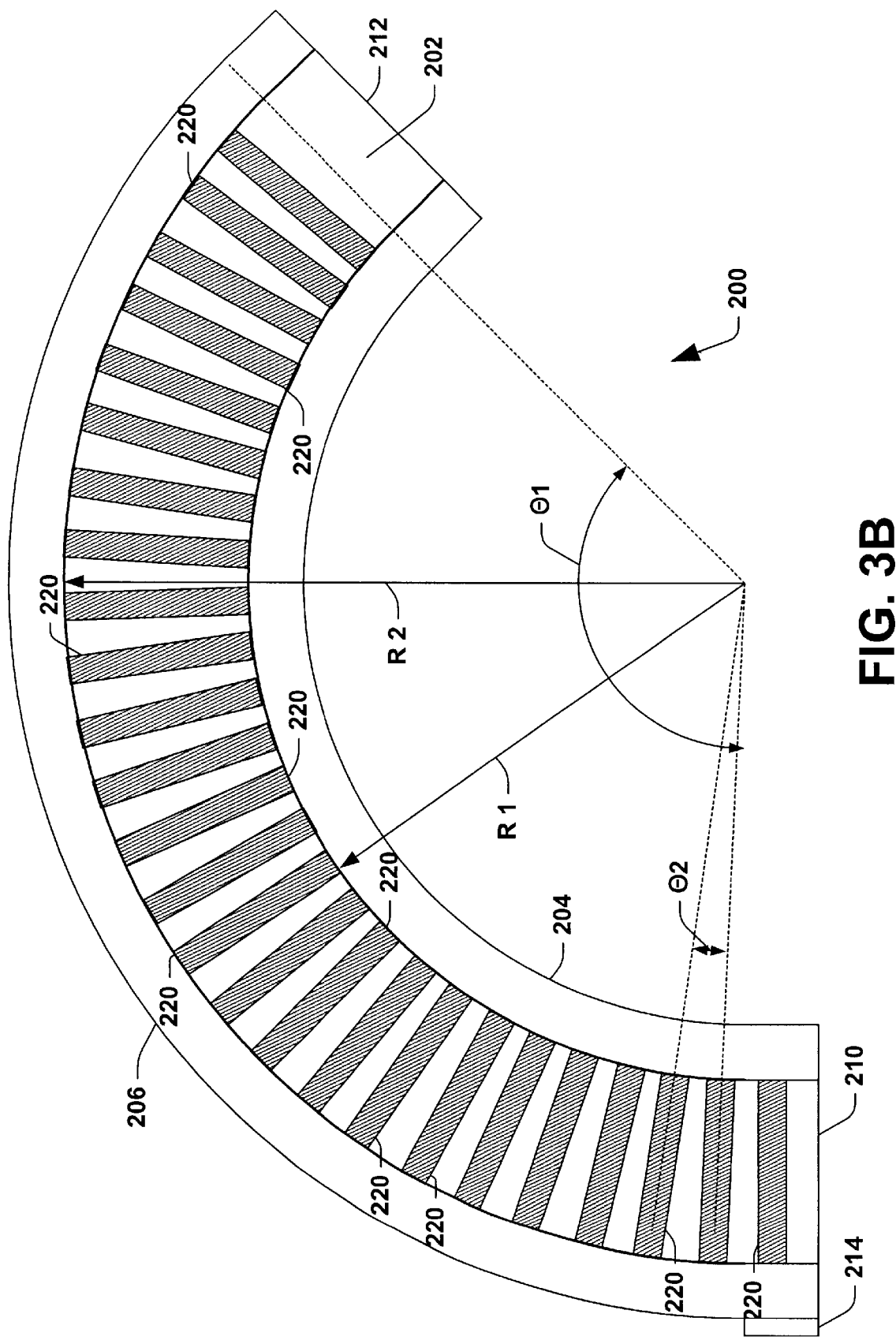
FIG. 3B is a sectional plan view of the exemplary mass analyzer taken along line 3B—3B of FIG. 3A.

FIGS. 3A and 3B illustrate an end elevation view and a sectional plan view, respectively, of the exemplary mass analyzer beam guide 200 of FIG. 2, having a plurality of magnets 220 associated therewith for generating a multi-cusped magnetic field in accordance with an aspect of the invention. Magnets 220 extend laterally between an inner radius R1 and an outer radius R2 in the passageway 202 in a longitudinally spaced relationship along the path 208, with an angular spacing θ2, which may be, for example, 5.326 degrees. In one exemplary implementation of the invention, the inner radius R1 may be about 300 mm and the outer radius R2 may be about 500 mm. The passageway 202 is further defined by top and bottom walls 222 and 224, respectively. The dipole field may be generated externally to the beamguide 200 by an electromagnet (not shown). In another implementation of the invention, the magnets 220 are embedded into one or both of the beamguide walls 222 and 224 in slots machined from the outside thereof, such that the magnets 220 remain outside of the vacuum chamber. In addition, it will be recognized that magnets 220 may be provided in one or both of the top and bottom walls 222, and 224, respectively, or on one or both of the side walls 204 and 206, respectively, or any combination thereof.

Figure 5:
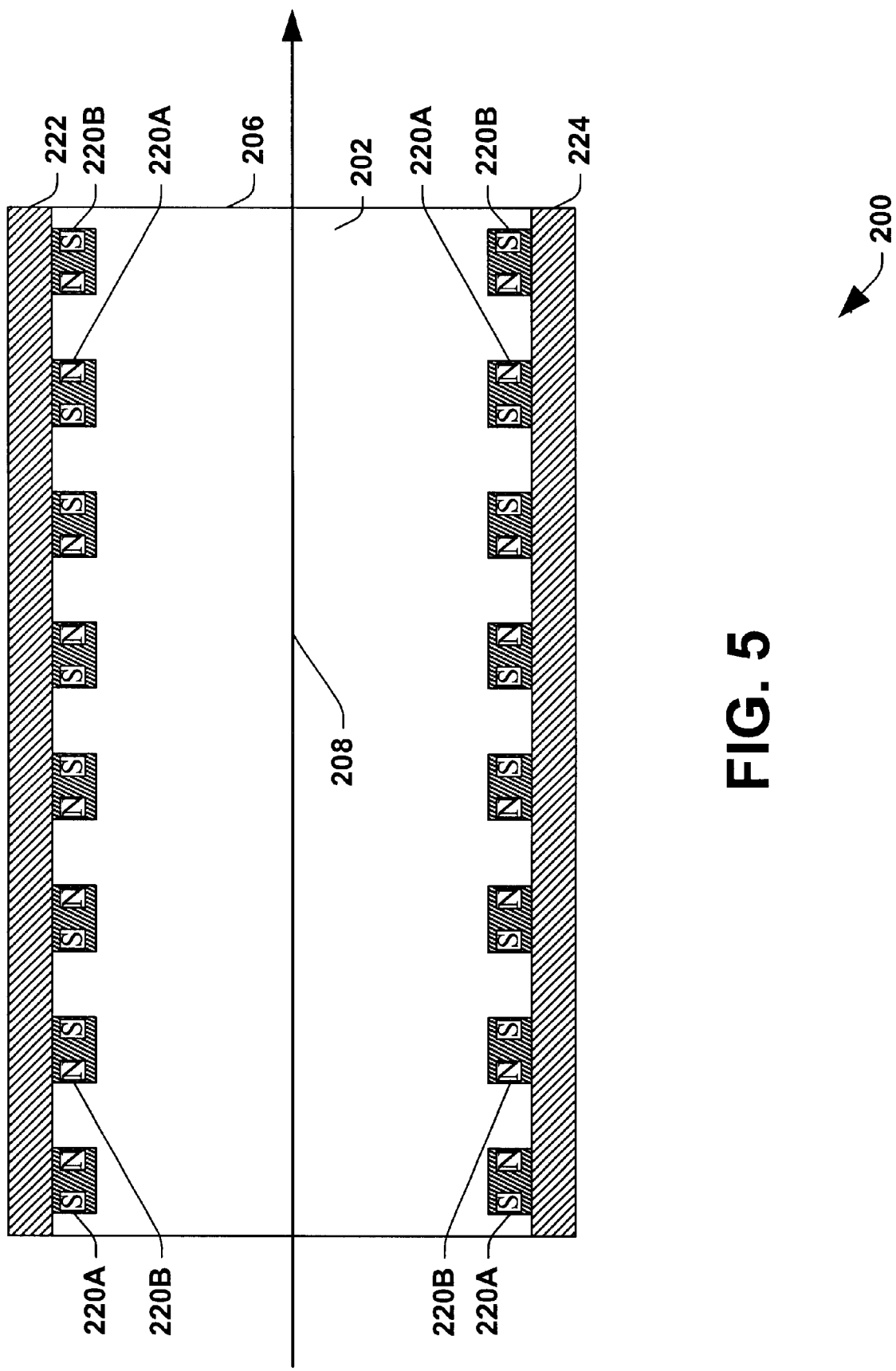
FIG. 5 is a sectional side elevation view of the exemplary mass analyzer taken along line 5—5 of FIG. 2.

FIGS. 4 and 5 respectively illustrate the mass analyzer beam guide 200 in longitudinal and lateral section along section lines 4—4 and 5—5 of FIG. 2. As seen in FIG. 5, magnets 220 are magnetized longitudinally along the propagation direction of the ion beam path 208, and are staggered such that adjacent magnets have like polarity poles facing each other. For clarity, the magnets 220 having south poles facing toward the entrance end 210 of the beam guide 200 are indicated as 220A and magnets 220 having south poles facing toward the exit end 212 of the guide 200 are indicated as 220B. In order to facilitate the mass analysis function, a dipole magnetic field is established in the passageway 206, for example, via an external electromagnet (not shown) having vertical field lines 230 as illustrated in FIG. 4.

Figure 6:
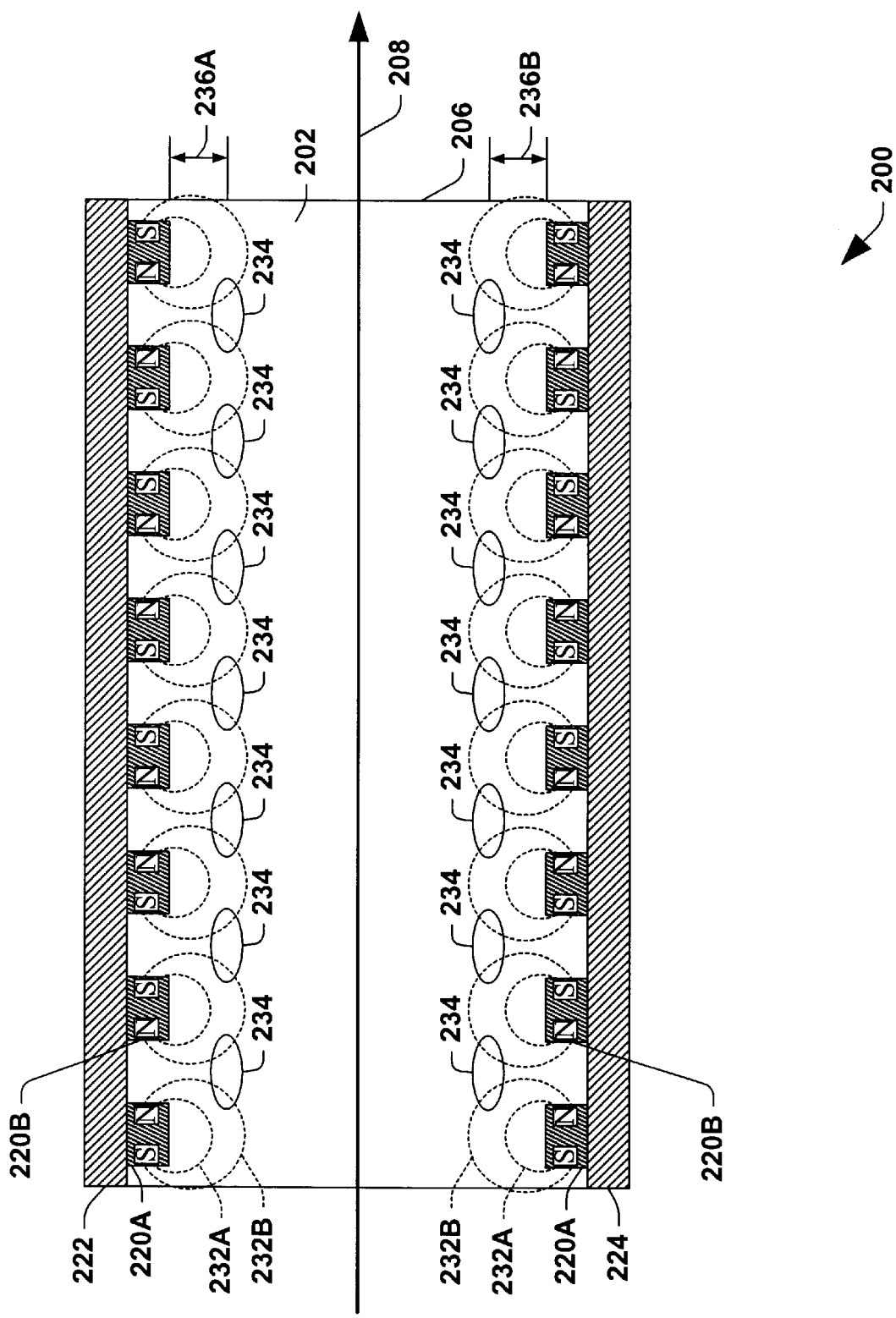
FIG. 6 is a side elevation view illustrating exemplary multi-cusped magnetic fields in the exemplary mass analyzer of FIG. 5.

Referring also to FIG. 6, the exemplary bipolar magnets 220A and 220B create individual magnetic fields, illustrated for simplicity with exemplary field lines 232A and 232B which cooperate to form multi-cusped magnetic fields near and spaced from the top and bottom walls 222 and 224, respectively, in the passageway 206. The exemplary placement of magnets 220A and 220B illustrated in the various figures illustrates similarly oriented magnets 220 vertically aligned (e.g., magnet 220A directly above magnet 220A, magnet 220B directly above magnet 220B). However, it will be appreciated that orientations other than those specifically illustrated and described herein are possible and are contemplated as falling within the scope of the present invention.

The orientation of magnets 220A and 220B illustrated in FIGS. 5 and 6, for example, advantageously provides additive magnetic field lines in the areas between adjacent magnets 220, although this is not required for the invention. Where RF or microwave energy is provided in the passageway 206 (e.g., via power source 216 and microwave injection port 214 of FIG. 2), the cooperative interaction between the magnetic and electric fields results in the creation of an electron cyclotron resonance (ECR) condition in regions 234 spaced a distance 236A and 236B from the magnets 220.

The ECR condition in regions 234 advantageously provides enhancement of the beam plasma associated with an ion beam traveling through the passageway 206 along the path 208, whereby beam integrity is improved along the longitudinal length of the mass analyzer beam guide 200. The creation of an ECR condition in one or more regions 234 around an ion beam prevents beam "blow-up" by facilitating the transfer of energy to the plasma surrounding the beam, thereby enhancing the plasma. An electron cyclotron resonance condition occurs when an alternating electric field is applied to a charged particle in a static magnetic field, such that the frequency of the electric field matches the natural frequency of rotation of the charged particle around the static magnetic field lines. Where this resonance condition is attained (e.g., in regions 234), a single frequency electromagnetic wave can accelerate a charged particle very efficiently.

It will be appreciated that the sizing, orientation, and spacing of the magnets 220 within the passageway 206 allow the location of the ECR regions 234 to be generated in accordance with desired ion beam containment goals. For example, the strength of the magnets 220 may be varied in order to change the distance 236A and/or 236B between the inner surfaces of the magnets 220 and the ECR regions 234. In this manner, the distances 236A and 236B may be adjusted according to the passageway size and/or the desired ion beam size. In addition, the spacing between adjacent magnets 220 may be changed in order to vary the spacing between adjacent ECR regions 234. Furthermore, the relative orientations of the magnetic pole faces of adjacent magnets may be varied in order to provide additive magnetic field lines between adjacent magnets 220. Many different magnet sizes, orientations, and spacings are possible and contemplated as falling within the scope of the present invention.

In accordance with the present invention, the multi-cusped magnetic field employed to obtain the ECR condition may be successfully superimposed near the edges of the dipole field. The plasma produced at the resonance surface where the correct magnetic field strength value is obtained expands toward the center of the ion beam along the dipole field lines, in a direction opposite to the field gradient. The introduction of the electric field into the beam guide passageway 202 may further be aided by the use of a waveguide in the passageway as illustrated and described in greater detail infra.

Figure 7A:
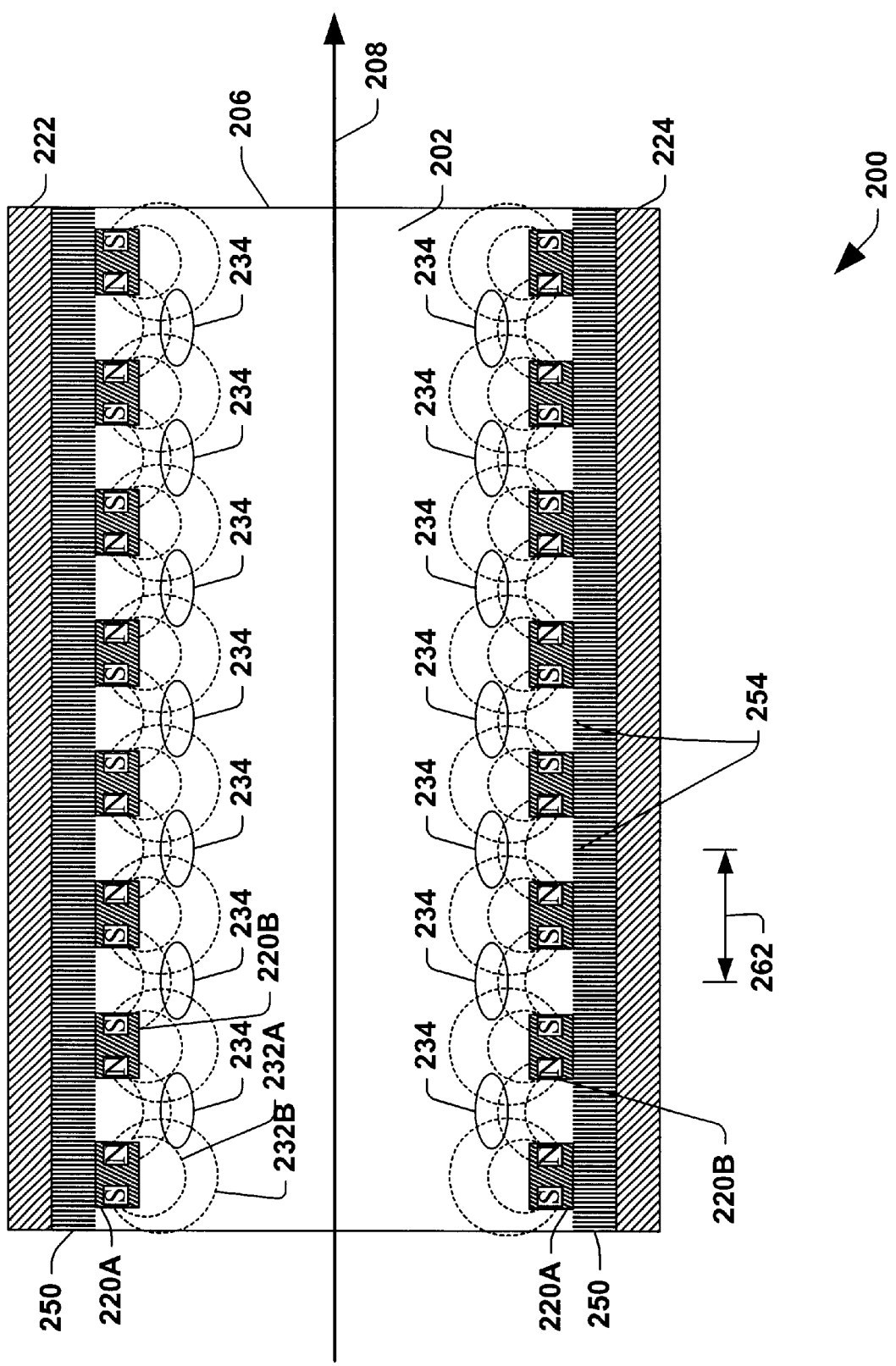
FIG. 7A is a side elevation view in section illustrating another exemplary mass analyzer with a waveguide according to another aspect of the invention.
Figure 7B:
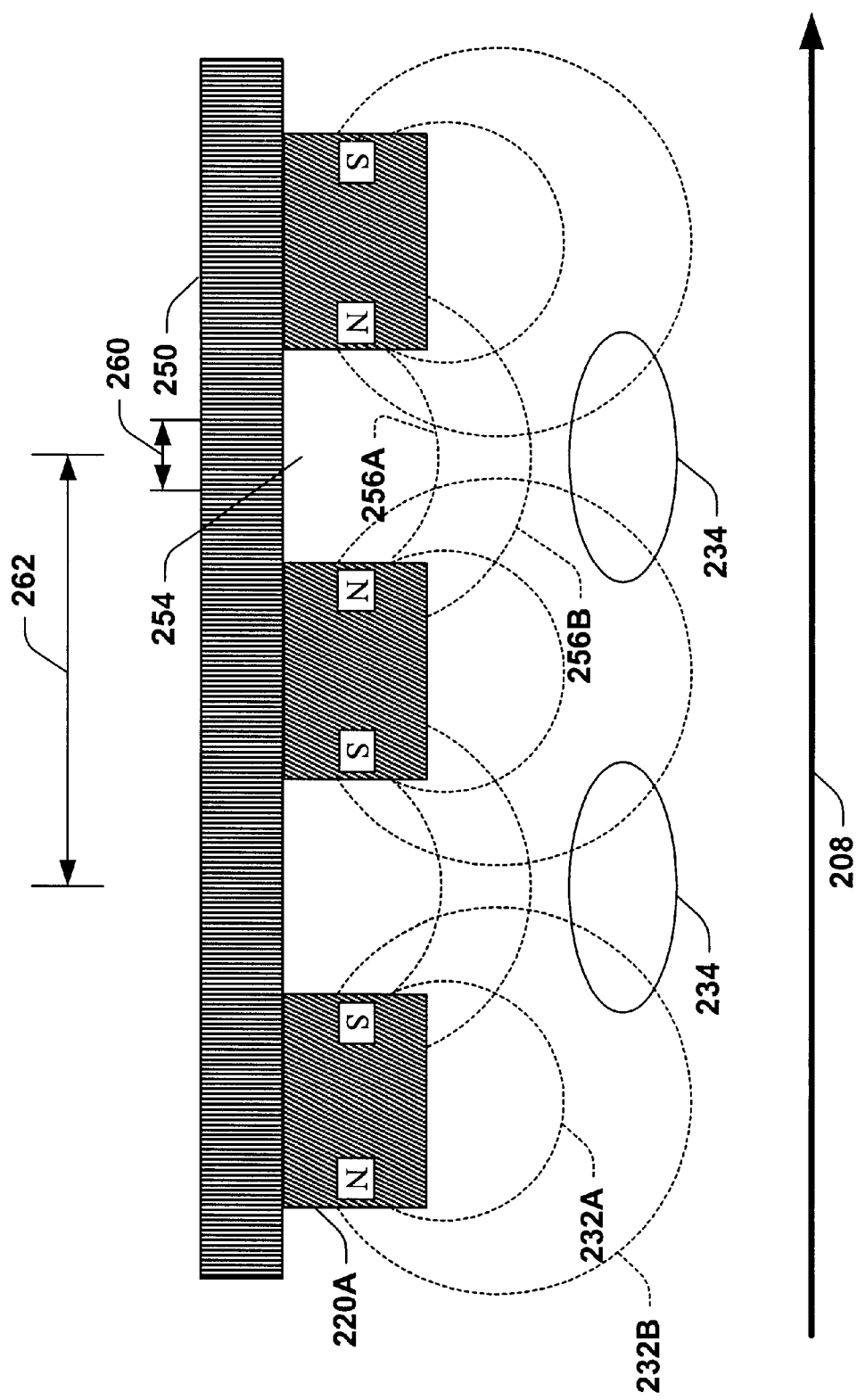
FIG. 7B is another side elevation view of the exemplary mass analyzer and waveguide of FIG. 7A.

Referring now to FIGS. 7A and 7B, another aspect of the invention is illustrated in reference to mass analyzer beam guide 200, wherein a sectional side elevation view is provided. The beam guide 200 comprises top and bottom walls 222 and 224, respectively, an outer sidewall 206, and an inner side wall (not shown) defining a passageway 202 through which an ion beam (not shown) propagates along a path 208. A plurality of magnets 220A and 220B (collectively designated as 220) are provided in similar fashion to the magnets 220 of FIGS. 3A–6 which extend laterally between the inner side wall and the outer side wall 206, in a spaced relationship to each other such that the longitudinally opposite magnet poles of adjacent magnets 220 face one another. Oriented in this fashion, the magnets 220 provide a multi-cusped magnetic field in the passageway 202 near the top and bottom walls 222 and 224, which field is illustrated by exemplary field lines 232A and 232B. A mass analysis electromagnet (not shown) outside of the beamguide may provide a dipole magnetic field (not shown) adapted to provide the mass analysis functionality discussed supra.

Unlike the mass analyzer implementations in the previous figures, the beam guide 200 of FIGS. 7A and 7B further comprises one or more waveguides 250. The waveguide comprises a suitable propagation medium such as quartz, that is metalized on all sides by a thin coating (e.g., aluminum). Since the skin depth at 2.54 GHz is less than one micrometer, a metalization layer coating thickness of a few microns is adequate. Laterally extending ports or slots 254 are provided in the inwardly facing metalization layers of the waveguides 250 between adjacent magnets 220 for coupling RF or microwave energy from the waveguide 250 into the passageway 202 of the beam guide 200 as described in greater detail infra. The waveguides 250 may be coupled to an RF or microwave power source (e.g., source 216 of FIG. 2) through any known method (e.g., windows, antennas, and the like), whereby standing wave resonance may be established in the waveguides 250 along the longitudinal length thereof. It will be appreciated that although two waveguides (e.g., upper and lower) 250 are illustrated in the figures, that other configurations, including a single waveguide 250, may be employed according to the invention.

The RF or microwave energy provides electric fields in the passageway 202 illustrated by exemplary electric field lines 256A and 256B in FIG. 7B which cooperatively interact with the multi-cusped magnetic fields generated by the magnets 220 to provide ECR regions 234 spaced from the top and bottom walls 222 and 224. As discussed supra, the ECR condition promotes the enhancement of the beam plasma associated with an ion beam (not shown) propagating through the passageway 202 of the beam guide 200 along the path 208, whereby the integrity of the beam is maintained by the reduction or elimination of beam "blow-up". The ports or slots 254 in the waveguide 250 extend laterally between the inner side wall (not shown in FIGS. 7A and 7B) and the outer side wall 206 having a width 260 and adjacent ports or slots 254 are longitudinally spaced by an angular pitch distance 262 which is the pitch spacing of the magnets 220.

Figure 8A:
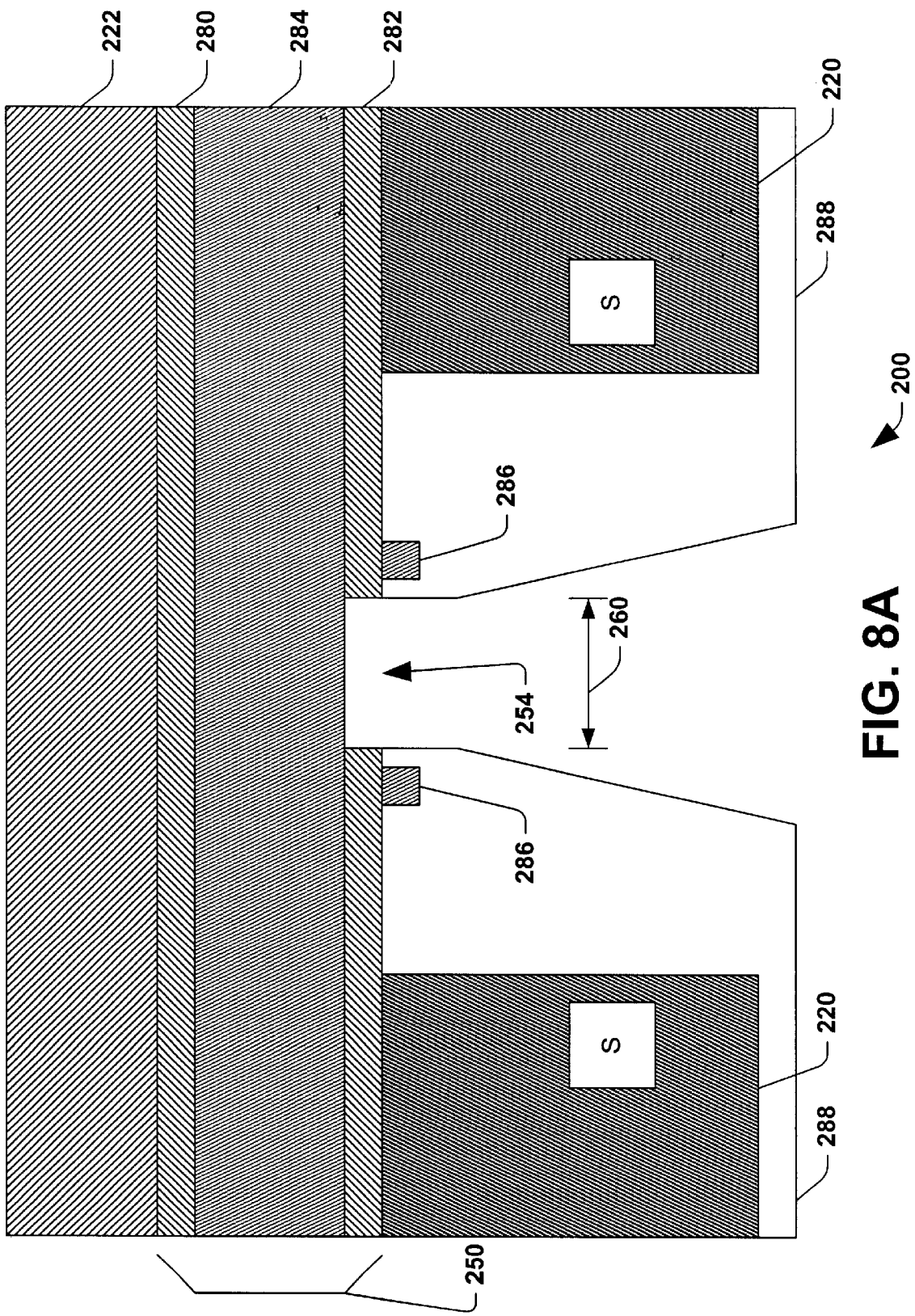
FIG. 8A is a side elevation view in section illustrating a portion of an exemplary waveguide and magnets in a mass analyzer for generating a multi-cusped magnetic field in accordance with another aspect of the invention.

Referring also to FIGS. 8A and 8B, another exemplary waveguide 250 is illustrated in section, mounted between wall 222 and the multi-cusped field magnets 220. According to another aspect of the invention, the waveguide 250 comprises upper and lower metalized layers 280 and 282, respectively above and below a base layer 284 adapted to propagate RF or microwave energy for introduction into the passageway 202 of the beam guide 200. Laterally extending ports or slots 254 are provided in the lower support layer 282 exposing the base layer 284 to the interior of the passageway 202. In addition, O-rings 286 may be provided encircling the slots 254 in order to seal the magnets from the vacuum region. According to still another exemplary aspect of the invention, the base layer 284 may be made from quartz, the upper and lower metalized layers 280 and 282, respectively, may be made from aluminum, the O-rings 286 may be made from a suitable elastomer, and the beam guide cover 288 may be made from aluminum. Alternatively, however, other materials may be employed and are contemplated as falling within the scope of the present invention.

Figure 8C:
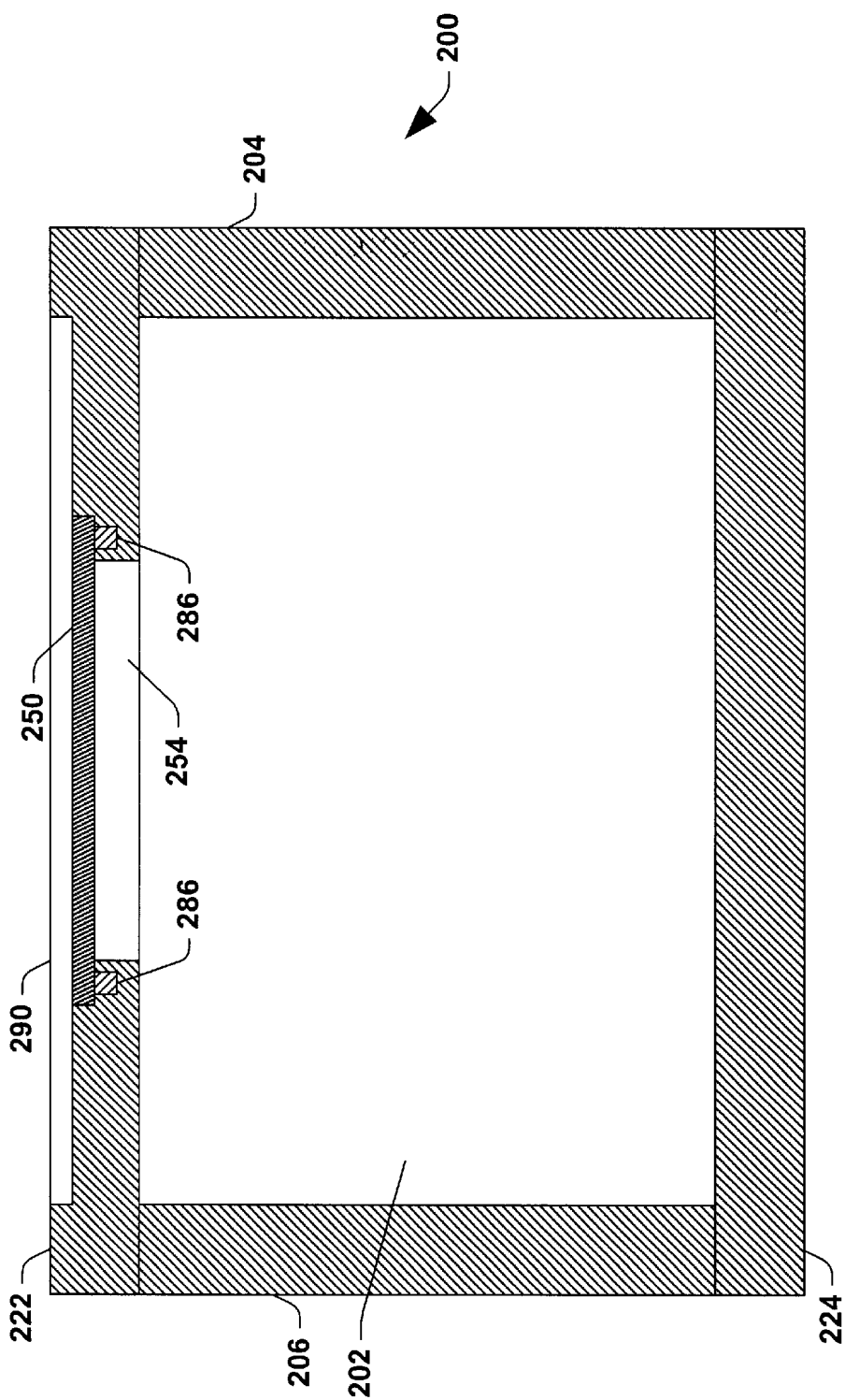
FIG. 8C is a front elevation view in section taken along line 8C—8C of FIG. 8B illustrating a portion of the exemplary waveguide of FIGS. 8A–8B.
Figure 8D:
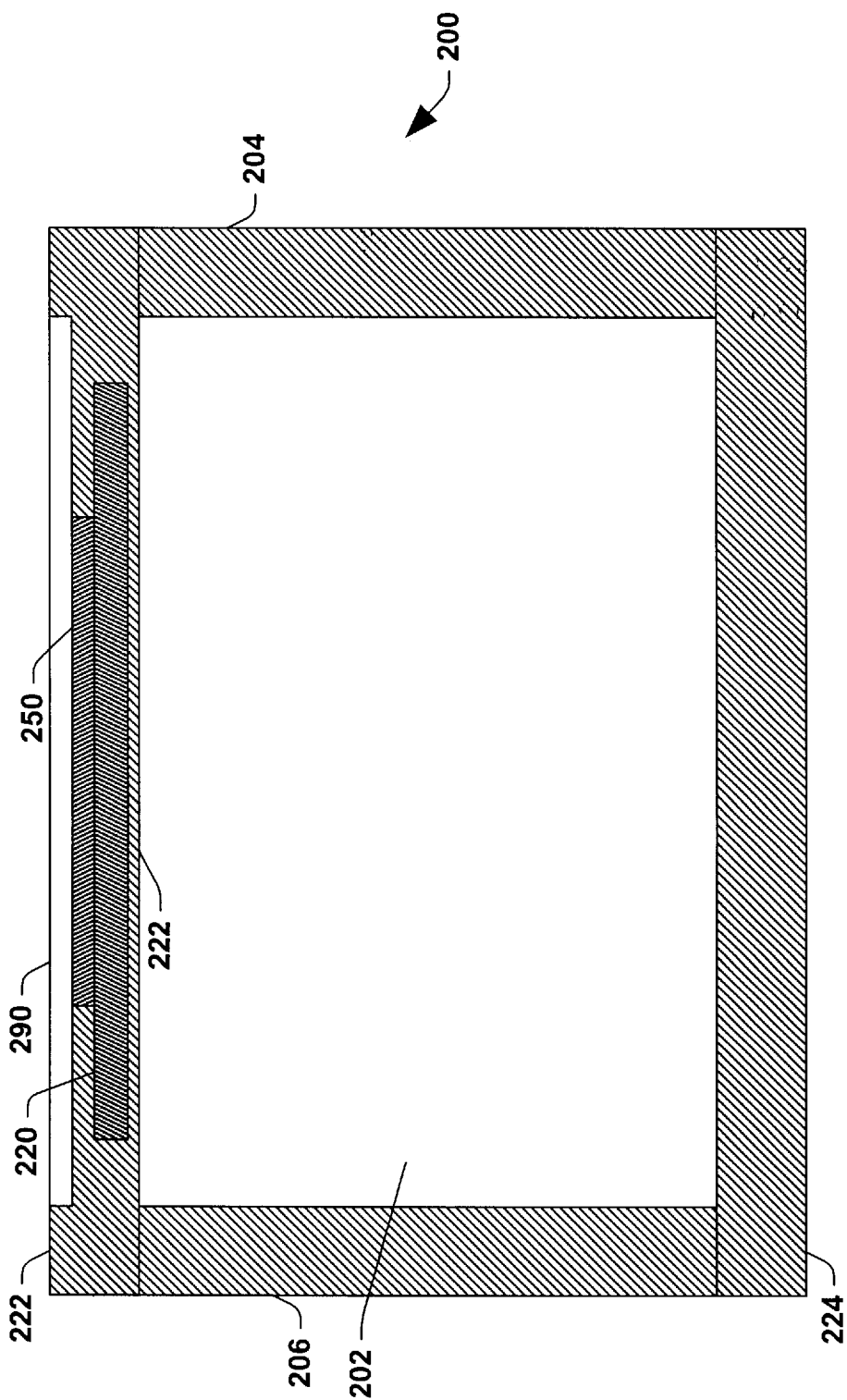
FIG. 8D is another front elevation view in section taken along line 8D—8D of FIG. 8B illustrating a portion of the exemplary waveguide of FIGS. 8A–8C.

Referring now to FIGS. 8C and 8D, side section views of the exemplary beamguide 200 and waveguide 250 are illustrated. In accordance with the invention, the top wall 222 may include a recess for supporting the waveguide 250, as well as a seating surface for compressing the o-ring 286 around the slot 254. The beamguide 200 may further include a top cover 290 allowing removable mounting of the waveguide 250 in the top wall 222. Referring also to FIG. 8D, the top wall 222 may also include a recess or pocket in which the magnets 220 are seated. The o-rings 286 around the slots 254 thus providing for isolation of the magnets from the vacuum of the inner passageway 202.

Figure 9:
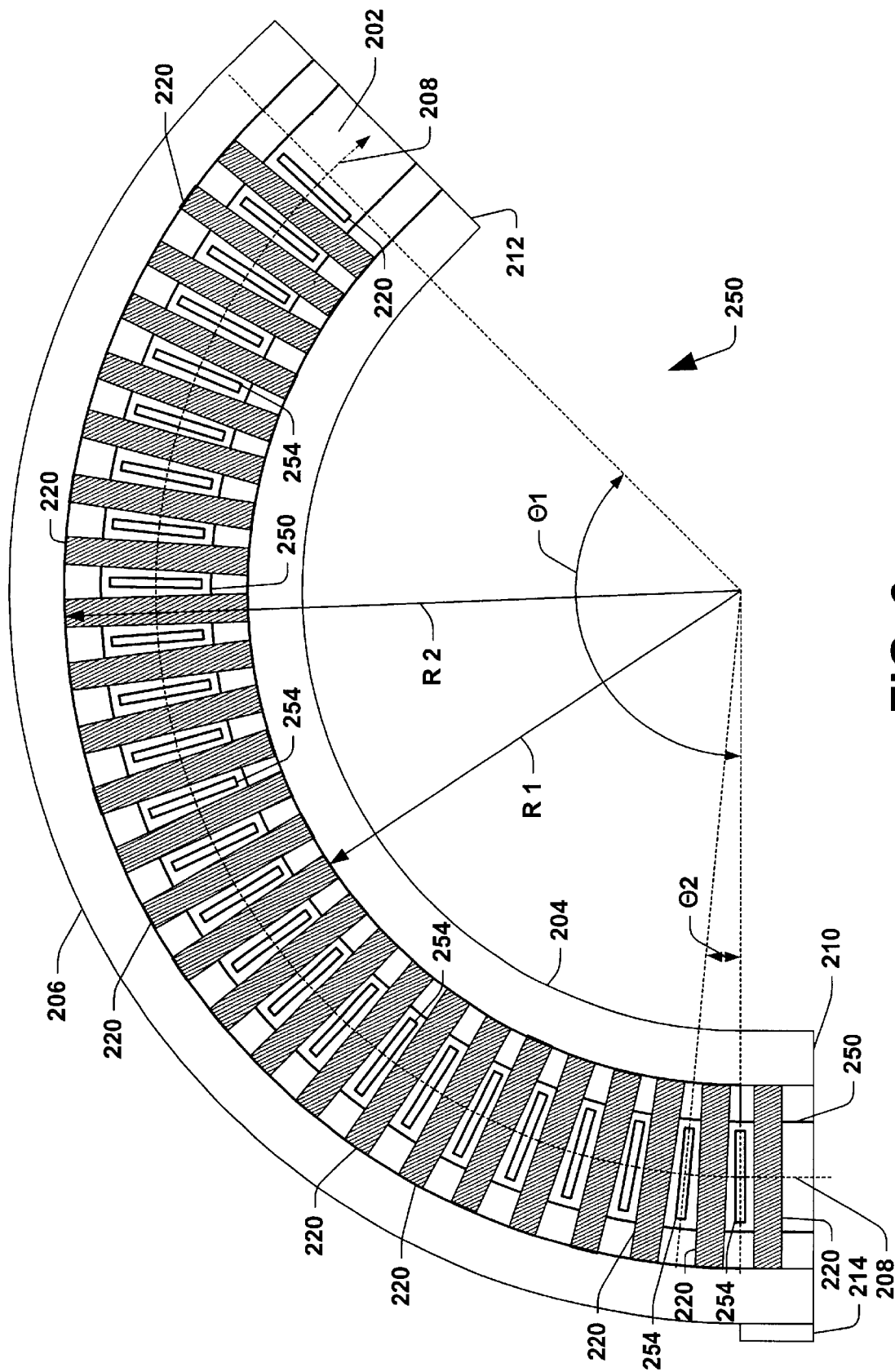
FIG. 9 is a sectional top plan view illustrating an exemplary mass analyzer with magnets for generating a multi-cusped magnetic field in accordance with another aspect of the invention.

Referring now to FIG. 9, the waveguide 250 is shown installed in a beam guide 200, where the waveguide 250 extends along the path 208 of the ion beam propagation. The pitch spacing of the magnets 220 is the same as that of the waveguide ports or slots 254, having an angular value of θ2, for example 5.326 degrees, providing for 25 equally spaced magnets 220 along an angular beam guide length of θ1, for example, approximately 135 degrees.

In operation, RF or microwave energy (e.g., provided by power source 216 via cable 218 and microwave injection port 214) is propagated in the waveguide 250 located behind the multi-cusped magnetic field generating magnets 220. The energy is coupled to the beam plasma (not shown) via the periodically distributed ports or slots 254 for creation of the ECR condition (e.g., in regions 234 of FIGS. 7A and 7B) conducive to plasma enhancement employed for beam containment.

Figure 10:
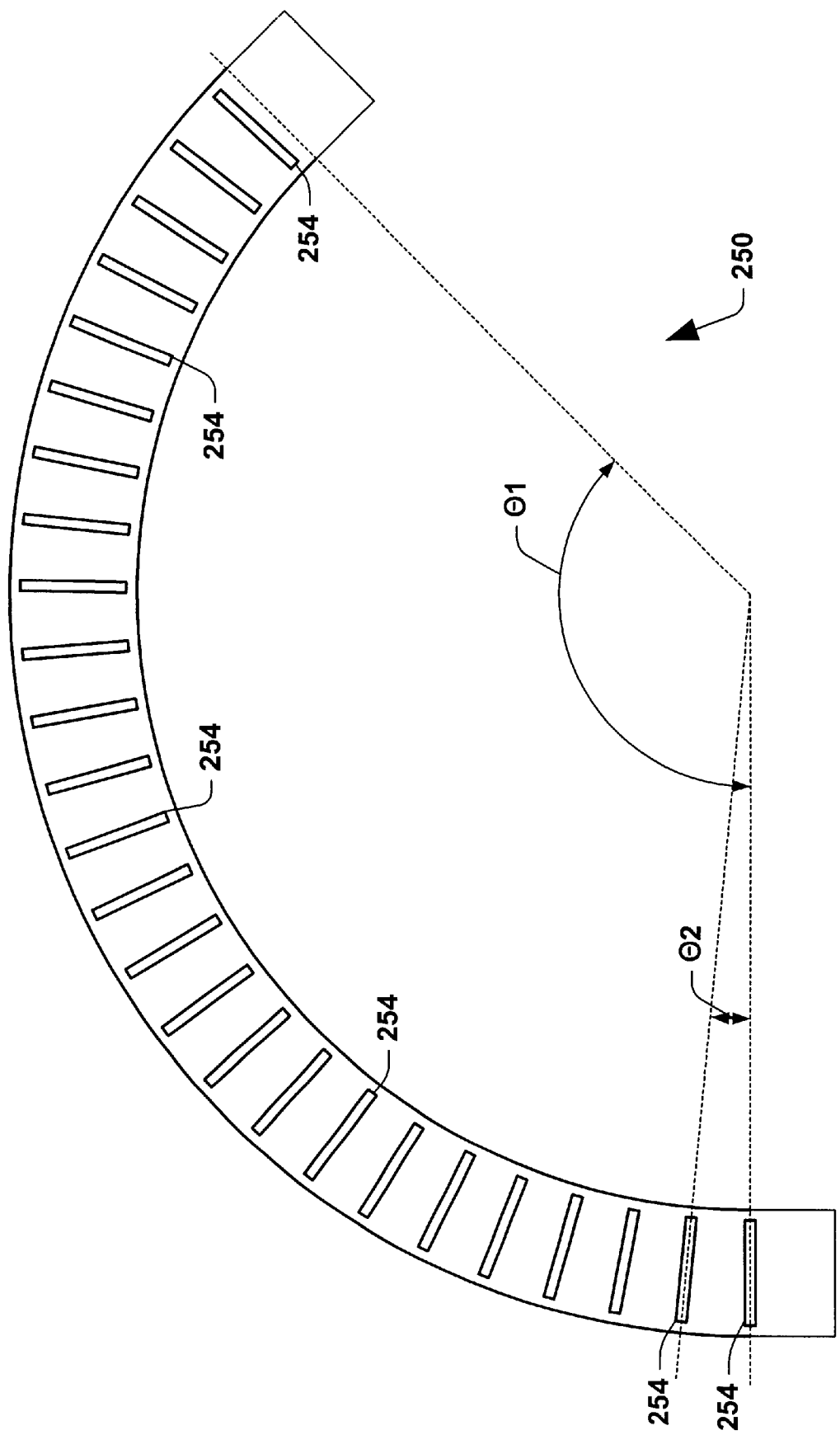
FIG. 10 is a top plan view illustrating an exemplary waveguide in accordance with another aspect of the invention.

As illustrated further in FIG. 10, the waveguide 250 furthers the generation of RF or microwave electric fields of sufficient magnitude orthogonal to the fixed magnetic fields at many locations (e.g., regions 234 of FIGS. 7A and 7B) along the beam propagation path 208. Toward that end, the length of the waveguide 250 may be set at a multiple of ½ wavelengths (e.g., $n\lambda/2$, where n is an integer) corresponding to the RF or microwave power source frequency (e.g., 2.45 GHz), with the coupling ports or slots 254 located at ½ wavelength locations. The waveguide 250 may therefore constitute a resonant structure where standing waves can be produced therein with the ports or slots 254 located where the E field is minimum and the H field is maximum (e.g., "H" coupling). The length of the ports or slots 254 in the waveguide 250 may be maximized (e.g., slots 254 are nearly as long laterally as the width of the waveguide 250) and the width may be optimized for nominal impedance matching. For example, in the exemplary waveguide 250, the angular slot spacing (an hence the spacing of the magnets 220) is approximately 5.326 degrees, the inner radius R1 is approximately 370 mm, and the outer radius R2 is approximately 430 mm. The length of the ports or slots 254 in this example is approximately 50 mm, and the width is approximately 5 mm.

In order to obtain consistent electric field patterns in the beam guide 200, it is desirable to excite a single dominant propagation mode. For example, the TE10 propagation mode for rectangular cross-section waveguides provides an electric field that is normal to the broadwall of the guide with a (1) peak in the center of the broadwall. The field magnitude is constant along the direction parallel to the narrow wall (e.g., "0" peaks). This TE10 has the lowest cut-off frequency. The cut-off frequencies for the TEx0 modes depend only on the broadwall dimension. Higher order modes TEn0 have progressively higher cut-off frequencies. According to one aspect of the invention, by choosing the size of the broadwall such that the cut-off frequency for the TE20 mode is slightly larger than the operating frequency (e.g., 2.45 GHZ), the widest possible waveguide 250 is selected which will only propagate the single TE10 mode. Once the waveguide dimensions are so chosen, the propagation wavelength is determined.

An electric field develops across the ports or slots 254 outside the waveguide 250 in the interior of the beam guide passageway 202, which is oriented along the ion beam propagation direction (e.g., path 208). A magnetic field (e.g., multi-cusped field) is generated that is perpendicular to the electric field, with the proper magnitude for creating the ECR resonance condition in the regions 234 of the passageway 202. For example, a BF2+ ion beam at an energy of 1.19 keV requires a magnetic field strength of 873 Gauss to follow the proper trajectory in a mass analyzer of a nominal 400 mm bending radius for creating the ECR condition. The ECR regions 234 may be located advantageously close enough to the slots 254 in the waveguide 250 to benefit from the high electric field intensity, yet sufficiently spaced from any surface (e.g., magnets 220, waveguide 250, etc.) to minimize plasma losses. For example, the ECR regions 234 of FIGS. 7A and 7B may be located a distance 236 away from the magnets 220, which may be in the range of about 4 to 6 mm, with a nominal distance of about 5 mm providing proper operation.

Referring now to FIG. 11, a method 300 of providing ion beam containment in a low energy ion implantation system is illustrated. The method begins at step 302 wherein an ion beam is produced along a longitudinal path using an ion source. A mass analyzer is provided at step 304 having an inner passageway, a high frequency power source, a mass analysis magnet mounted in the inner passageway, and a magnetic device mounted in the inner passageway. The ion beam is received in the mass analyzer from the ion source at step 306, and ions of appropriate charge-to-mass ratio are directed at step 308 from the mass analyzer along the path toward a wafer or other target to be implanted with ions. At step 310, an electric field is generated in the passageway using a high frequency power source. A multi-cusped magnetic field is generated at step 312 using a magnetic device mounted in the passageway, which may create advantageously an ECR condition therein.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A mass analyzer apparatus for conditioning an ion beam along a path in an ion implantation system, comprising:
    a housing defining a passageway along the path;
    a mass analysis magnet mounted along the passageway along the path;
    a power source adapted to provide an electric field in the passageway; and
    a magnetic device adapted to provide a multi-cusped magnetic field in the passageway;
    wherein the power source and the magnetic device are cooperatively adapted to provide containment of the ion beam in at least a portion of the passageway.

2. The apparatus of claim 1, wherein the magnetic device comprises a plurality of magnets mounted along at least the portion of the passageway.

3. The apparatus of claim 1, wherein the power source and the magnetic device are cooperatively adapted to provide an electron cyclotron resonance condition along at least the portion of the passageway.

4. The apparatus of claim 1, further comprising a top, a bottom, and laterally opposite first and second sides defining the passageway, wherein the top, bottom, first and second sides extend longitudinally along the path between an entrance end and an exit end, and wherein the magnetic device comprises a plurality of longitudinally spaced laterally extending magnets disposed in the passageway on one of the top and bottom sides between the entrance and exit ends.

5. The apparatus of claim 4, further comprising a waveguide extending longitudinally along the path between the entrance and exit ends and extending between the plurality of longitudinally spaced magnets and the one of the top and bottom sides of the passageway, and having a plurality of laterally extending slots located between adjacent magnets, wherein the waveguide is adapted to couple energy in the form of an electric field from the power source to the interior of the passageway, whereby the electric field and the multi-cusped magnetic field cooperatively interact to create an electron cyclotron resonance condition along at least a portion of the passageway.

6. The apparatus of claim 4, wherein at least two of the magnets include longitudinally opposite magnetic poles of opposite magnetic polarity and are located adjacent one another with poles of like polarity facing one another, whereby the multi-cusp magnetic field is generated thereby in the passageway.

7. The apparatus of claim 6, wherein the power source and the magnetic device are cooperatively adapted to provide an electron cyclotron resonance condition along at least the portion of the passageway.

8. The apparatus of claim 1, wherein the magnetic device comprises a plurality of longitudinally spaced laterally extending magnets disposed in the passageway on both of the top and bottom sides between the entrance and exit ends, wherein the electric field and the magnetic field are cooperatively adapted to create an electron cyclotron resonance condition in at least one region in the passageway, and wherein the at least one region is near at least two longitudinally facing magnetic poles of at least two adjacent magnets and spaced from one of the at least two adjacent magnets by a distance in the range of about 4 to 6 mm.

9. The apparatus of claim 8, wherein the passageway has a longitudinally arcuate lateral profile.

10. The apparatus of claim 8, wherein the at least one region is near at least two longitudinally facing magnetic poles of at least two adjacent magnets and spaced from one of the at least two adjacent magnets by a distance of about 5 mm.

11. The apparatus of claim 8, wherein the power source provides electric field energy in the passageway at a fixed frequency of about 2.45 GHZ, and wherein the magnetic field strength in the at least one region in the passageway is about 873 Gauss, and wherein the ion beam has an energy of about 1.19 keV.

12. The apparatus of claim 8, further comprising a waveguide extending longitudinally along the path between the entrance and exit ends and extending between the plurality of longitudinally spaced magnets and one of the top and bottom sides of the passageway and having a plurality of laterally extending slots located between adjacent magnets, wherein the waveguide is adapted to couple energy in the form of an electric field from the power source to the interior of the passageway, whereby the electric field and the multi-cusped magnetic field cooperatively interact to create the electron cyclotron resonance condition along at least a portion of the passageway.

13. An ion implantation system, comprising:
    an ion source adapted to produce an ion beam along a path; and
    a mass analyzer having an inner passageway, a power source, a mass analysis magnet mounted in the inner passageway, and a magnetic device mounted in the inner passageway, wherein the mass analyzer is adapted to receive the ion beam from the ion source and to direct ions of appropriate charge-to-mass ratio along the path toward a wafer, and wherein the power source is adapted to provide an electric field in the inner passageway, and the magnetic device is adapted to provide a multi-cusped magnetic field in the inner passageway, and further wherein the electric field and the multi-cusped magnetic field cooperatively provide ion beam containment in at least a portion of the inner passageway.

14. The system of claim 13, wherein the magnetic device comprises a plurality of magnets mounted along at least a portion of the passageway.

15. The system of claim 13, wherein the power source provides an electric field in the passageway, wherein the electric field and the multi-cusped magnetic field provide an electron cyclotron resonance condition along at least a portion of the inner passageway.

16. The system of claim 13, wherein the mass analyzer further comprises a top, a bottom, and laterally opposite first and second sides defining the inner passageway, wherein the top, bottom, first and second sides extend longitudinally along the path between an entrance end and an exit end, wherein the magnetic device comprises a plurality of longitudinally spaced laterally extending magnets disposed in the passageway on one of the top and bottom sides between the entrance and exit ends.

17. The system of claim 16, wherein at least two of the magnets include longitudinally opposite magnetic poles of opposite magnetic polarity and are located adjacent one another with poles of like polarity facing one another, whereby the multi-cusp magnetic field is generated in the inner passageway.

18. The system of claim 17, wherein the magnetic device comprises a plurality of longitudinally spaced laterally extending magnets disposed in the inner passageway on both of the top and bottom sides between the entrance and exit ends, wherein the electric field and the magnetic field create an electron cyclotron resonance condition in at least one region in the inner passageway, and wherein the at least one region is near at least two longitudinally facing magnetic poles of at least two adjacent magnets and spaced from one of the top and bottom sides by a distance in the range of about 4 to 6 mm.

19. The system of claim 18, further comprising a waveguide extending longitudinally along the path between the entrance and exit ends and extending between the plurality of longitudinally spaced magnets and one of the top and bottom sides of the inner passageway and having a plurality of laterally extending slots located between adjacent magnets, wherein the waveguide is adapted to couple energy in the form of an electric field from the high frequency power source to the interior of the inner passageway, whereby the electric field and the multi-cusped magnetic field cooperatively interact to create an electron cyclotron resonance condition along at least a portion of the inner passageway.

20. The system of claim 18, wherein the at least one region is near at least two longitudinally facing magnetic poles of at least two adjacent magnets and spaced from one of the top and bottom sides by a distance of about 5 mm.

21. The system of claim 20, wherein the power source provides electric field energy in the inner passageway at a frequency of about 2.45 GHZ, wherein the magnetic field strength in the at least one region in the inner passageway is about 873 Gauss, and wherein the ion beam has an energy of about 1.19 keV.

22. A mass analyzer apparatus for conditioning an ion beam along a path in an ion implantation system, comprising:

a mass analysis magnet mounted in a passageway along the path;

a fixed frequency power source adapted to provide an electric field in the passageway; and a magnetic device adapted to provide a multi-cusped magnetic field in the passageway;

wherein the fixed frequency power source and the magnetic device are cooperatively adapted to provide containment of the ion beam in at least a portion of the passageway.

23. A method of providing ion beam containment in an ion implantation system, comprising:

producing an ion beam along a longitudinal path using an ion source;

providing a mass analyzer having an inner passageway and a mass analysis magnet mounted in the inner passageway;

receiving the ion beam in the mass analyzer from the ion source;

directing ions of appropriate charge-to-mass ratio from the mass analyzer along the path toward a wafer; and generating an electron cyclotron resonance condition in at least a portion of the inner passageway, whereby the electron cyclotron resonance condition provides ion beam containment thereat.

24. The method of claim 23, wherein generating the electron cyclotron resonance condition in at least a portion of the inner passageway comprises:

generating an electric field in the passageway using a high frequency power source mounted in the passageway; and generating a multi-cusped magnetic field in at least a portion of the passageway using a magnetic device mounted in the passageway, wherein the electric field and the multi-cusped magnetic field cooperatively interact to create the electron cyclotron resonance condition in the at least a portion of the inner passageway.

25. The method of claim 24, wherein the magnetic device comprises a plurality of longitudinally spaced laterally extending magnets disposed in the passageway on both of the top and bottom sides between the entrance and exit ends, further comprising creating an electron cyclotron resonance condition in at least one region in the passageway using the electric field and the magnetic field, wherein the at least one region is near at least two longitudinally facing magnetic poles of at least two adjacent magnets and spaced from one of the top and bottom sides by a distance in the range of about 4 to 6 mm.

* * * * *